United States Patent
Swinnen et al.

(10) Patent No.: US 7,795,113 B2
(45) Date of Patent: Sep. 14, 2010

(54) METHOD FOR BONDING A DIE OR SUBSTRATE TO A CARRIER

(75) Inventors: Bart Swinnen, Holsbeek (BE); Eric Beyne, Leuven (BE)

(73) Assignee: IMEC (BE)

( * ) Notice: Subject to any disclaimer, the term of this patent is extended or adjusted under 35 U.S.C. 154(b) by 143 days.

(21) Appl. No.: 11/963,487

(22) Filed: Dec. 21, 2007

(65) Prior Publication Data

US 2008/0166525 A1    Jul. 10, 2008

Related U.S. Application Data

(60) Provisional application No. 60/876,240, filed on Dec. 21, 2006.

(30) Foreign Application Priority Data

May 16, 2007    (EP)    ................................. 07108370

(51) Int. Cl.
H01L 21/46    (2006.01)
(52) U.S. Cl. ..................... 438/458; 438/455; 438/464

(58) Field of Classification Search ................ 438/455, 438/458, 459, 460, 464, 465
See application file for complete search history.

(56) References Cited

U.S. PATENT DOCUMENTS

| | | | |
|---|---|---|---|
| 6,143,628 A * | 11/2000 | Sato et al. | 438/455 |
| 6,287,891 B1 * | 9/2001 | Sayyah | 438/106 |
| 6,420,242 B1 * | 7/2002 | Cheung et al. | 438/458 |
| 6,911,375 B2 * | 6/2005 | Guarini et al. | 438/455 |

* cited by examiner

*Primary Examiner*—Kevin M Picardat
(74) *Attorney, Agent, or Firm*—Knobbe Martens Olson & Bear LLP (57) ABSTRACT

A method is disclosed for bonding two elements by means of a bonding agent such as a glue layer, wherein the bonding agent is removable, and wherein between the bonding agent and at least one element, a sacrificial layer is applied which is selectively removable with respect to that element. According to embodiments, the elements comprise a die or a substrate bonded to a carrier wafer. The nature and type of the die or substrate and of the carrier can vary within the scope of embodiments of the invention. Also disclosed is a composite substrate obtainable by methods of the invention.

11 Claims, 7 Drawing Sheets

METHOD FOR BONDING A DIE OR SUBSTRATE TO A CARRIER

CROSS REFERENCE TO RELATED APPLICATIONS

This application claims priority under 35 U.S.C. §119(e) to U.S. provisional patent application No. 60/876,240 filed on Dec. 21, 2006, which application is hereby incorporated by reference in its entirety.

BACKGROUND

1. Field of the Invention

The present invention is generally related to the field of microelectronics. It is related more specifically to techniques for bonding a substrate or die to a carrier as used, for instance, in microelectronics packaging and/or stacking technologies.

2. Description of the Related Technology

Substrates or dies often need to be bonded temporarily to carrier wafers, on which they may be further handled, processed or thinned. This is for instance the case when performing wafer or die thinning where the wafer or die is temporarily bonded to a carrier (typically used for extreme wafer thinning). An example of such a process can be found in U.S. Pat. No. 6,506,664, in some aspects relating to the stacking of Ultra Thin Chips.

Glue layers can be used to achieve such a temporary bond. Such glue or bonding layers need to be compatible with all processes performed on the substrate or die while it is bonded. For instance, mechanical and chemical stability is required.

When temporarily bonding a carrier to a substrate or die, depending on the glue layer (more generally bonding layer) used, the carrier can be released chemically (e.g., through etch or dissolution of the glue layer), thermally (e.g., through phase change or decomposition of the glue layer material), or under illumination (e.g., through breaking of a molecular bond).

Thermally decomposable glue layers and glue layers that are decomposable under illumination by radiation of a predetermined frequency spectrum have the advantage over chemically removable glues that carrier release is often easier or faster when compared to chemical release (especially for large bonded areas). When using a chemical release (corresponding to a chemically removable glue) the glue must be brought in contact with a chemical substance, and for large bonded areas this can occur only from the outer region inwards, resulting in a relatively slow release process.

In the embodiment of release by illumination, measures must be taken that the radiation can easily and preferably reach the glue or bonding layer with substantial uniformity, e.g., by making one of the bonded elements transparent to the radiation. Transparent should be understood as allowing enough radiation to pass through to achieve the effect of release. These insights also apply to certain embodiments.

For many thermally decomposable glue layers available today, it is very difficult or impossible to remove residues after the glue decomposition, especially without impacting the substrate or die, which is typically at least partially processed. For instance, high temperature processing such as, e.g., copper to copper thermo compression bonding, has shown to affect certain polymer glue layers, such that upon removal of this layer residues are left which are not removable or very difficult to remove.

Another technique involves the use of a sacrificial layer used for temporarily attaching the die to a carrier. The release is obtained by etching the sacrificial layer from the sides, which is however a time-consuming operation.

Document DE10320375 is related to a method for temporarily fixing two planar workpieces, e.g., a processed wafer to a glass carrier, wherein both components receive a release layer, and wherein the actual bond is established by a glue layer. The release of the workpieces takes place in a wet chemical process, wherein the release layers are dissolved and the glue layer is left over as waste.

Document US2004/0009649 is related to a method for bonding a wafer to a substrate, wherein the front surface of the wafer is temporarily attached to a support, thinned, and subsequently attached to the substrate where thereafter the support is released from the wafer surface. Optionally, a low stress material may be applied to the front surface of the wafer before attaching the wafer to the support.

SUMMARY

One aim of certain aspects of the present invention is to provide a method for bonding a die or substrate to a carrier, which alleviates or avoids the problems of the prior art.

Embodiments of the invention are related to methods and devices as described in the appended claims. In particular, one aspect of the invention is concerned with a method for bonding and releasing two elements, the bonding taking place by a bonding agent such as a glue layer, wherein the bonding agent is removable, and wherein between the bonding agent and at least one element, a sacrificial layer is applied which is selectively removable with respect to that element. The result of the bonding step is a composite substrate according to an embodiment.

In one aspect, the method further comprises subjecting the composite substrate to a temperature increase, wherein the first and second elements are released or become easily releasable due to a phase change of the removable attachment layer, and removing the sacrificial layer after the release of the first and second elements by an etching agent or a solvent, thereby also removing residues left from the removable attachment layer. According to an embodiment, the temperature increase takes place up to or above a transformation temperature, but below a critical temperature being the maximum temperature which the first element can withstand without incurring damage. According to an embodiment, the residues are not etchable in the etching agent, and are thus removed indirectly.

According to embodiments, the elements are a die or substrate bonded to a carrier wafer. According to embodiments, the bonding is temporary. The nature and type of the die or substrate and of the carrier can vary within the scope of the present invention. The die or substrate can comprise Back-end-of-line (BEOL) components or structures and Front-end-of-line (FEOL) components or structures and/or vias through the substrate or die, wherein the FEOL components/structures and the vias through the substrate are both optional. BEOL and FEOL are typical. The FEOL corresponds to operations performed on the semiconductor wafer in the course of device manufacturing up to first metallization. The BEOL corresponds to operations performed on the semiconductor wafer in the course of device manufacturing following first metallization.

Another aspect of the invention is related to a composite substrate comprising a first element bonded onto a second element by a bonding layer, wherein the bonding layer comprises at least 2 sub layers: a sacrificial layer being selectively removable with respect to the first element in contact with a first main surface of the first element; and a removable attachment layer in contact with the sacrificial layer comprising a material which can change from solid to non solid phase at a temperature below a critical temperature. According to embodiments, the critical temperature is the maximum temperature that the composite substrate can withstand without incurring damage.

BRIEF DESCRIPTION OF THE DRAWINGS

FIG. 1 and FIG. 2 illustrate prior art processes in which a carrier is bonded to a die or a substrate (the figures illustrate Back (11) and Front (10) end of line and through-the-substrate-or-die vias 12 which are optional, but typical) by a single glue layer. In FIG. 2, the thinning after bonding process is illustrated.

DETAILED DESCRIPTION OF CERTAIN EMBODIMENTS

Figure 1:
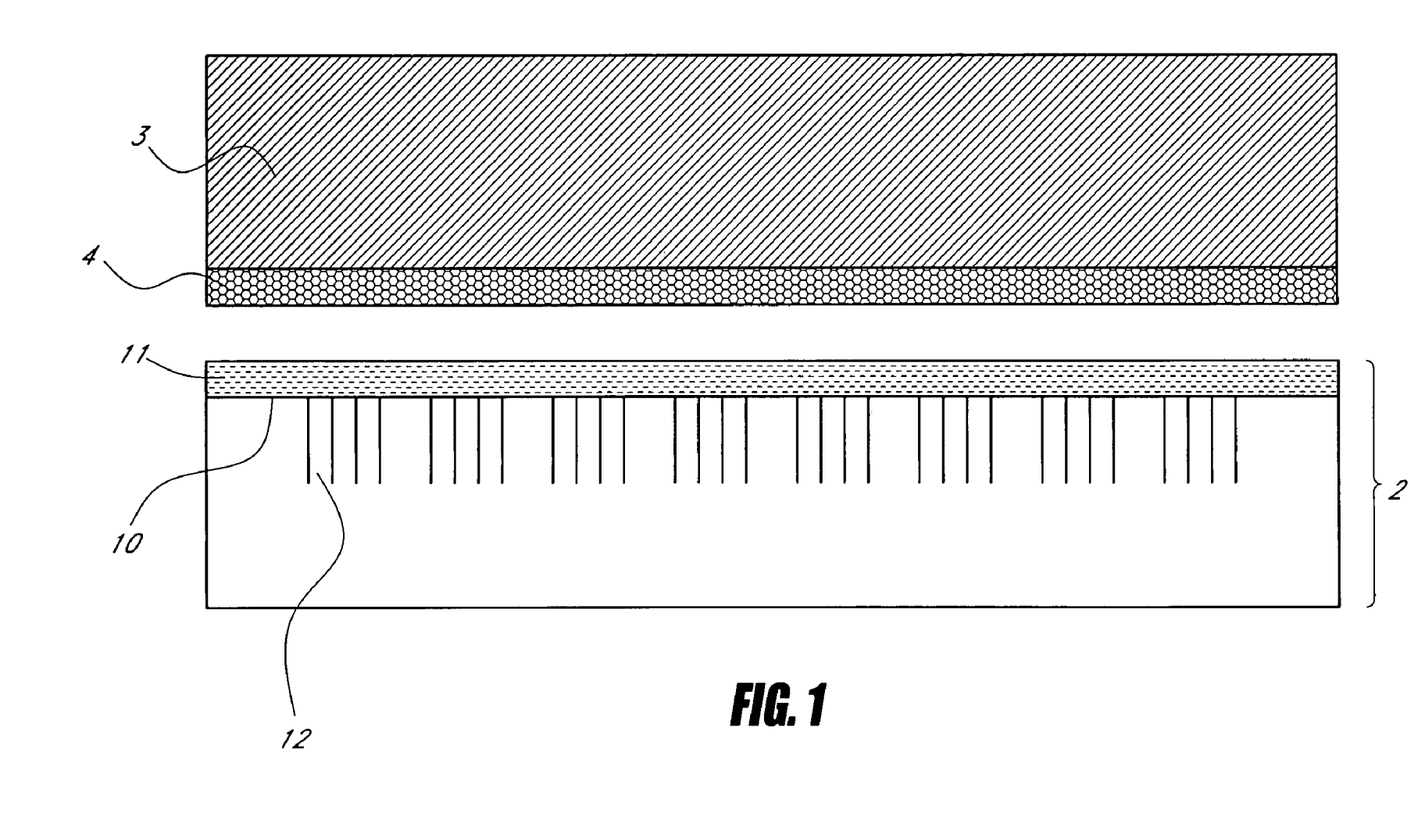
Figure 2:
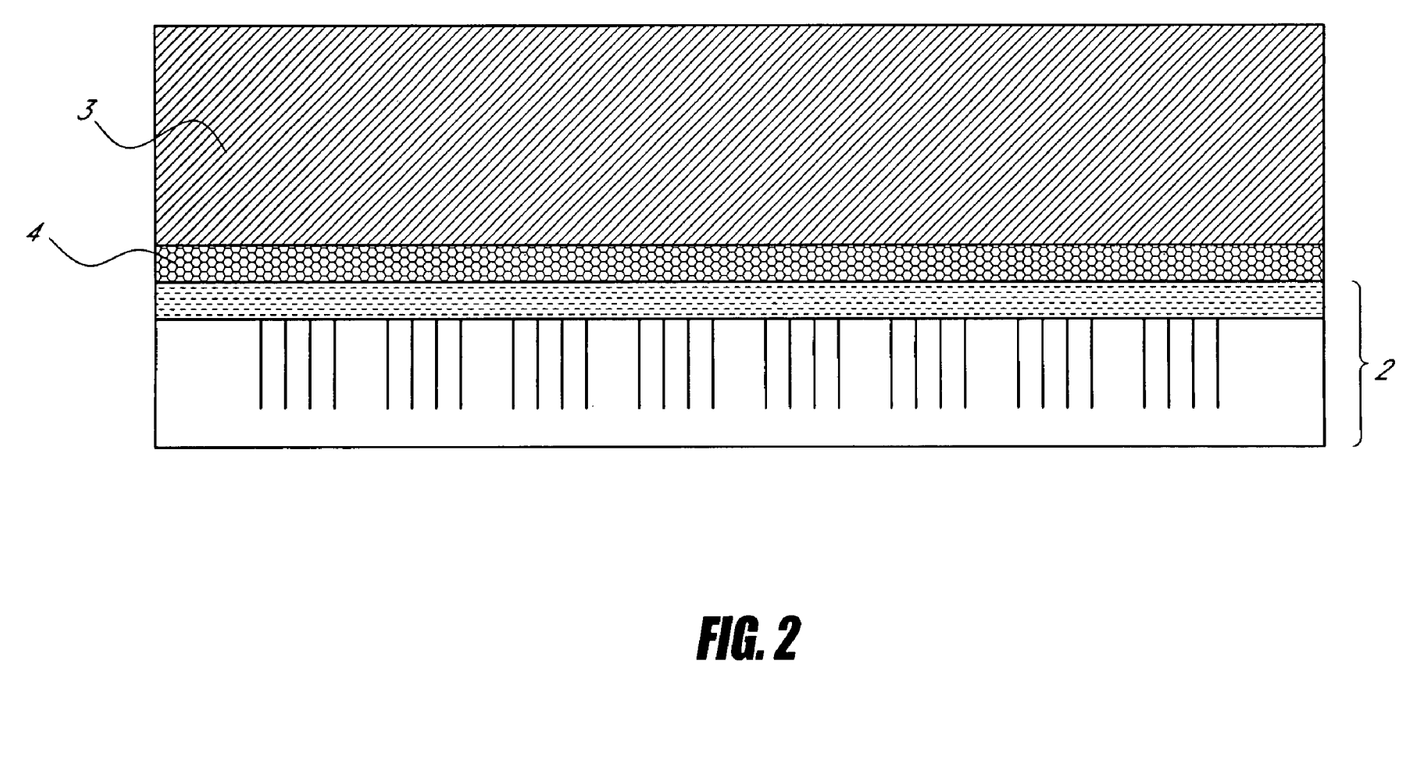
Figure 3:
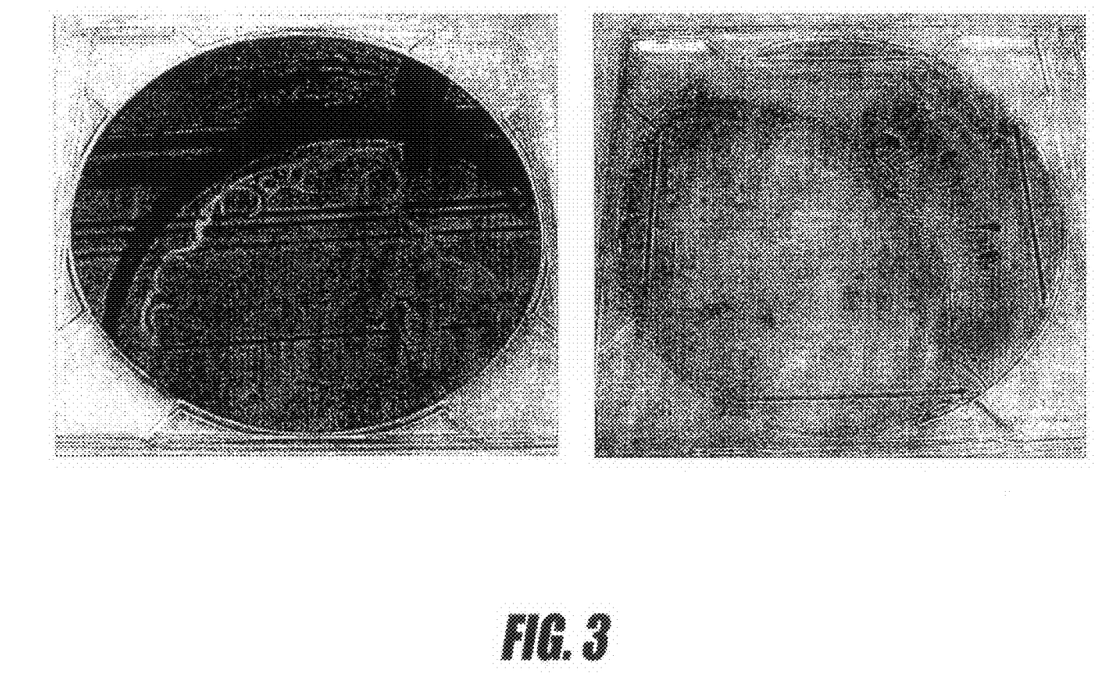
FIG. 3 shows a silicon device wafer and a glass carrier wafer after release of a temporary glue layer.
Figure 4A:
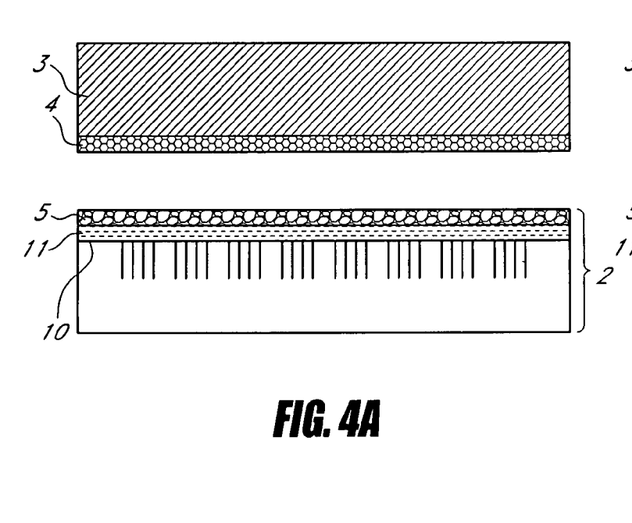
FIG. 4A and FIG. 4B show embodiments according to the present invention with the removable attachment layer on the sacrificial layer (FIG. 4B) or on the first main surface of the carrier substrate (FIG. 4A).
Figure 4B:
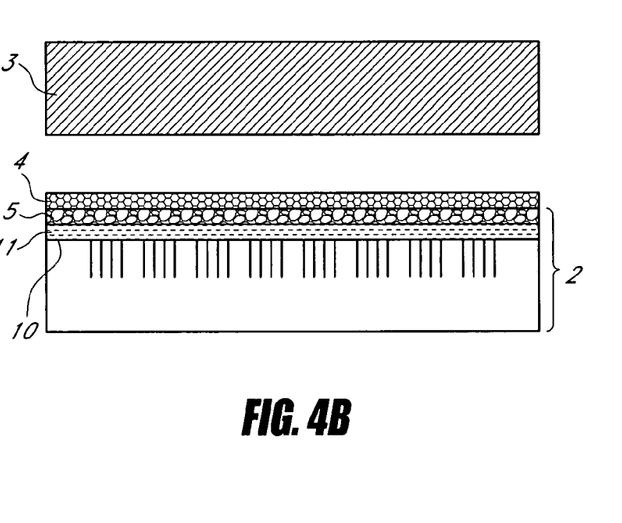
Figure 5:
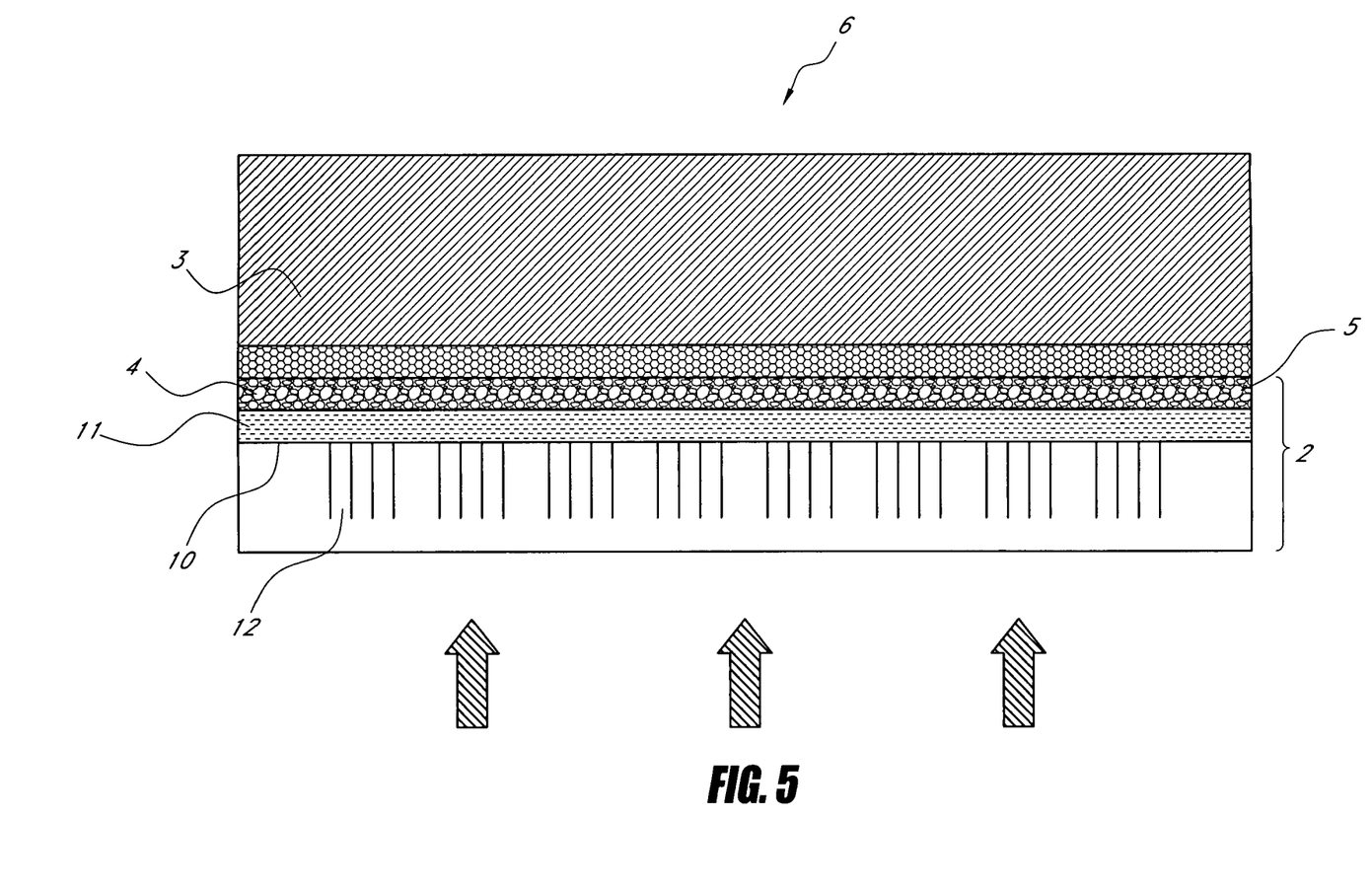
FIG. 5 illustrates the thinning after bonding process according to certain embodiments of the present invention.
Figure 6:
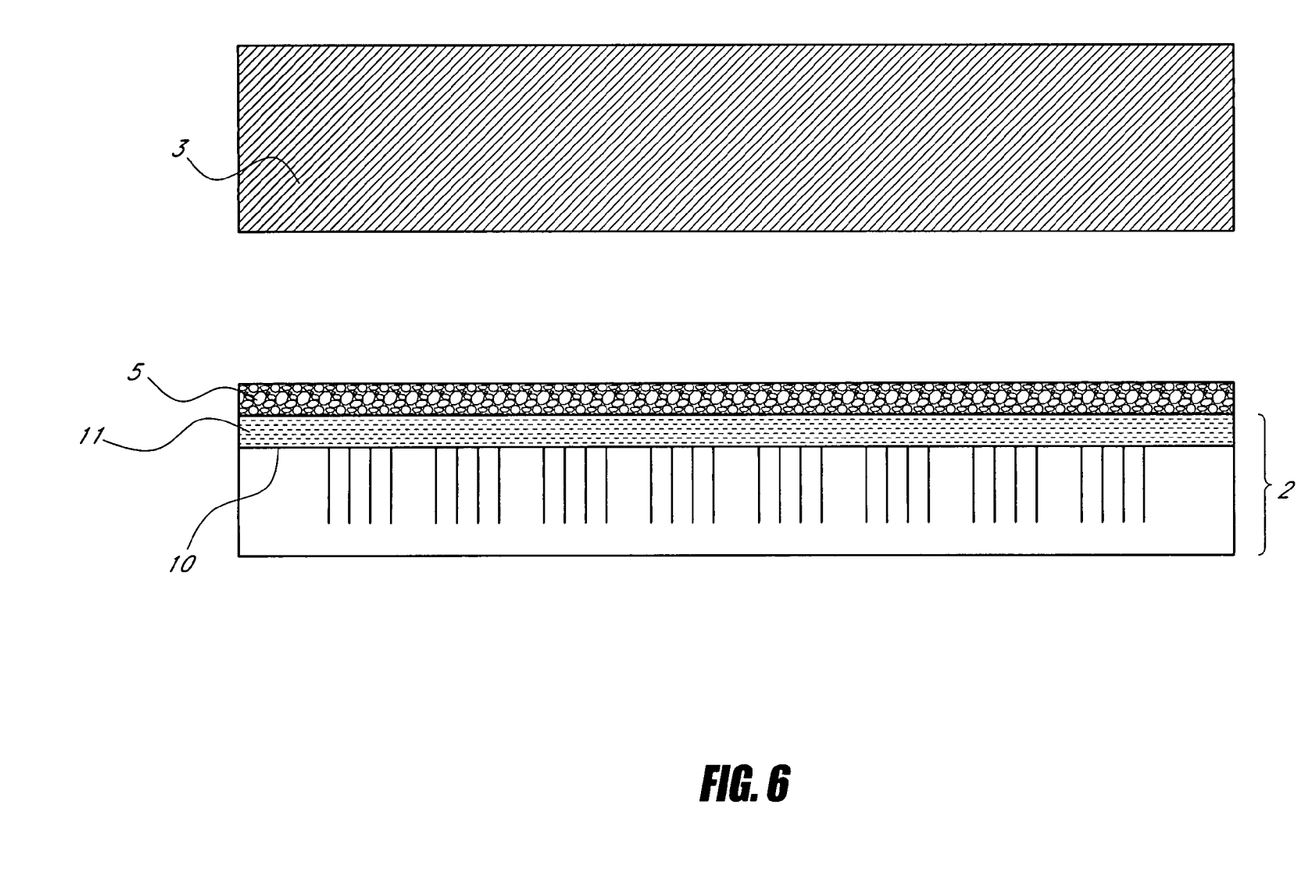
FIG. 6 illustrates the removal of the attachment layer, hereby separating the carrier and die or substrate again.
Figure 7:
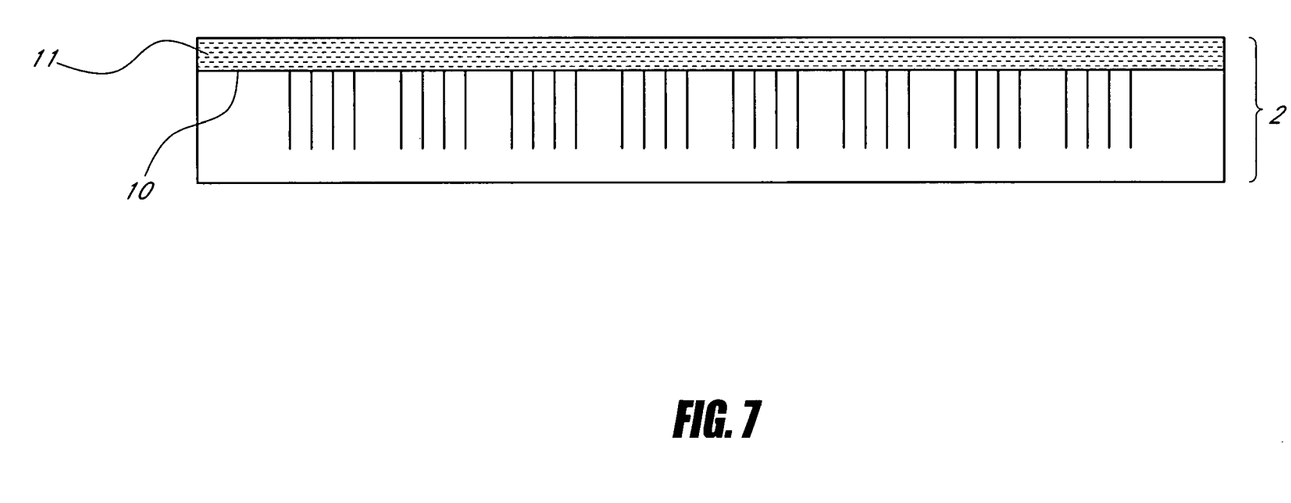
FIG. 7 illustrates further removal of the sacrificial layer, whereby residues left from the removable attachment layer are eliminated at the same time.

With reference to FIGS. 4A and 4B, one embodiment of the invention is related to a method for producing a composite substrate by bonding a first element (2) to a second element (3), the method comprising: providing a first element (2) having a main surface; providing a sacrificial layer (5) on the main surface of the first element, the sacrificial layer (5) being selectively removable with respect to the first element; providing a second element (3) having a main surface, applying a removable attachment layer (4) on top of the sacrificial layer or on top of the main surface of the second element, bonding the first element (2) to the second element by contacting one element to the removable attachment layer present on the other element.

In one aspect, the first element is preferably a die or a substrate. In another aspect, the second element is preferably a carrier wafer. The die or substrate may comprise Back End Of Line (BEOL) or Front End of Line (FEOL) layers 11 and 10. The die or substrate may also comprise vias 12.

The resulting composite substrate comprises a bonding layer, which essentially consists of the sacrificial layer 5 and the removable attachment layer 4.

In particular, one aspect of the invention concerns a method for forming a composite substrate (6) by bonding a die or substrate (2) to a carrier (3), comprising: providing a sacrificial layer (5) on a first main surface of the substrate or the die, the sacrificial layer (5) being selectively removable with respect to the substrate or die; providing a carrier (3), comprising a first main carrier surface; applying a removable layer (4) on top of the sacrificial layer or on top of a first main carrier surface; bonding the die or the substrate (2) with the carrier (3) by means of a bonding layer comprising a stack of sub layers formed by the sacrificial layer and the removable layer.

In one aspect, the sacrificial layer and removable layer are preferably in physical contact. The bonding layer can essentially consist of the sacrificial layer and the removable layer.

The term "selectively removable with respect to the substrate or die" should be understood as removable such that the die or substrate is not affected by the removal step, i.e., the die or substrate is left untouched or sufficiently untouched in view of the desired performance.

The removable attachment layer can comprise a material which changes from solid to non-solid phase at a transformation temperature below a critical temperature on top of the sacrificial layer or on top of the main carrier surface, the critical temperature being the maximum temperature that the die or substrate, and preferably the sacrificial layer, can withstand without incurring damage.

The removable attachment layer can also comprise or consist of a material that changes from solid to non-solid phase when illuminated with electromagnetic radiation of a predetermined frequency spectrum.

The transformation from solid to non-solid phase of the material of the removable attachment layer can be a transformation from solid to gas (sublimation or decomposition) or a transformation from solid to liquid (melting). In the first case, the die or substrate and the carrier (or the first element and the second element) may be released from each other essentially when the transformation takes place. In the latter case (melting) the substrate or die and the carrier may still be attached to each other due to adhesion, but are easily separable. They can for instance be glided off each other in the direction of their main surfaces.

In the case of melting, typically a wax material, or a thermo-plastic material (typically a thermally decomposable polymer), or thermoplastic polymer can be used. A polyimide can also be used in the removable attachment layer.

In the case of sublimation/decomposition, materials with limited thermal stability and sharp transitions from solid to gas phase can be used. Materials with slow transitions are also possible. Currently available materials include Unity from Promerus, Inc. Advantageously, types of materials that are used in copper-low-k applications to generate pores can be used.

The critical temperature is the temperature below which one must stay in order to avoid any negative influence, damage or change to the die or substrate due to this temperature. This temperature is application-dependent: for instance, typically about 200 degrees C. for memory applications, or about 400 degrees C. for CMOS devices.

The transformation temperature or transformation thermal budget should be below the critical temperature or critical thermal budget.

It should be noted that the parameter "critical temperature" has been chosen in defining certain embodiments. The critical temperature may be dependent on the time period of the temperature step. One could refer then to a critical thermal budget. The same applies for the transformation temperature, which can be referred to as a transformation thermal budget. For reasons of clarity the reference to a temperature has been preferred, but the terms can be replaced by the alternatives as mentioned above, in the following description.

According to one embodiment, the die or substrate is further processed after a phase transition from solid to liquid phase of the removable attachment layer has occurred or while the removable attachment layer is substantially or completely in a liquid state.

The sacrificial layer is preferably etchable by an etching agent according to an embodiment. It can be etchable by dry or wet etching. The sacrificial layer can alternatively be soluble in a solvent.

According to an embodiment, a further planarization of the removable attachment layer is applied before bonding, which may improve an optional thinning process of the die or substrate, especially when thinning via CMP or grinding or other techniques known in the art which exert pressure on the surface to be thinned.

The method used for forming composite substrates can be a base method (i.e., a method used as such, and not in combination with additional method steps), allowing the possibility of handling, thinning and processing temporarily bonded substrates or dies on a carrier substrate.

According to an embodiment, the substrate or die is further thinned after the bonding step. The thinning can be performed by any known technique, such as for instance Chemical Mechanical Polishing, grinding, wet or dry etching.

The thinning can be such that the die or substrate has a thickness larger than about 50 or larger than about 100, 200, 300, 400, 500 or 600 microns before thinning and a smaller thickness after thinning as for instance a smaller thickness smaller than about 50, 40, 30, 20, 10 or 5 microns afterwards.

In certain embodiments, the second main surface of the die or substrate (which may have been thinned, in which case the surface can be referred to as "thinned surface") can be further processed. For instance, solder balls can be applied, a backside diffusion barrier can be applied, e.g., a Cu diffusion barrier such as a SiN4 layer or a metallic barrier (Ta, TaN, Ti, TiN), or a layer can be deposited. Etching can be performed locally. Backside patterning can be performed.

Post processing can be associated with a maximal post processing temperature or post processing thermal budget. In embodiments comprising a thermal release, the maximal post processing temperature or post processing budget is preferably below the transformation temperature or transformation thermal budget respectively. The maximal post processing temperature or post processing budget may also be above the transformation temperature or transformation thermal budget respectively, as long as the transformation concerns a solid to liquid phase change of the removable attachment layer, which results in a still processable composite substrate; i.e., resulting in a sufficiently stable bond on which processing is still possible.

The composite structure can be subjected to a temperature increase up to or above the transformation temperature (as described in the previous paragraph where it can occur during an associated post processing act), but below the critical temperature, whereby the carrier wafer and the die or substrate are released or become easily releasable due to a phase change of the removable attachment layer.

According to an embodiment of the invention, the sacrificial layer is further removed (for instance by means of the etching agent or solvent) from the die or substrate, thereby also removing residues left from the removable attachment layer.

According to an embodiment, an etch-stop layer (not shown) is provided between the die or substrate and the sacrificial layer, wherein the etch-stop layer is resistant to the etching agent or solvent. Alternatively, the die may comprise a surface which is already resistant to the etching agent or solvent. Seen another way, the sacrificial layer and means for removing the sacrificial layer can be chosen as a function of the surface of the dies or substrates, if no separate etch stop layer is provided.

As the surface of the die or chip typically has exposed metal pads and dielectrics, the sacrificial layer in an embodiment is preferably a material that can be removed with high selectivity with respect to these metals and dielectrics. For example, when the chip materials are copper and a passivated nitride, this material could be silicon oxide (which allows selective wet etch using, e.g., HF diluted solutions), or a metal as aluminum or titanium that can be etched selectively with respect to copper.

At the same time, the sacrificial layer in an embodiment is preferably isotropically etchable, because of the presence on the sacrificial layer of residues of the glue layer. Such residues are normally not etched by the etching solvent, so the areas where residues are present should be underetched by the solvent, in order to remove the residues. If the sacrificial layer is anisotropically etched, the residue areas would remain and the sacrificial layer would only be removed in areas where no residues are present.

Often it is desirable for the surface of the die or substrate on which the sacrificial layer is applied to undergo a cleaning step anyway, and the removal of the sacrificial layer may provide such a cleaning simultaneously with the removal. This means that only one more step is taken in such embodiments when compared to the related art, where no sacrificial layer is applied, namely the extra act of providing the sacrificial layer.

Different sacrificial layers and associated means for removing the sacrificial layer may be used for different materials present at the chip surface.

Composite substrates generated by the methods according to certain embodiments are also disclosed below. Corresponding features, advantages and definitions from the description of the method are valid and applicable for the devices and are not necessarily repeated.

One aspect of the invention is related to a composite substrate produced by methods of the invention. Such a composite substrate comprises a first element bonded onto a second element by means of a bonding layer, characterized in that the bonding layer comprises at least two sub layers, a sacrificial layer being selectively removable with respect to the first element, and a removable attachment layer comprising a material which can change from solid to non solid phase at a temperature below a critical temperature, the removable attachment layer in contact with the sacrificial layer, the critical temperature being the maximum temperature that the composite substrate can withstand without incurring damage. In other embodiments, the removable attachment layer changes from solid to non solid phase when illuminated with radiation of a predetermined spectrum.

The sacrificial layer can be etchable by means of an etching agent, by dry or wet etching. The sacrificial layer can also be soluble in a solvent. In one aspect, the sacrificial layer is preferably isotropically etchable.

The first main surface of the die or substrate can have a non-flat topology.

The first main surface of the die or substrate can comprise an etch-stop layer, which is resistant to the etching agent. The etch-stop layer can be patterned.

The die or substrate can have a thickness below about 100 microns, or according to other embodiments, respectively below 90, 80, 70, 60, 50, 40, 30, 20, 10, or 5 microns.

The removable attachment layer can comprise a wax material or a thermo-plastic material (typically a thermally decomposable polymer) or thermoplastic polymer.

Materials with limited thermal stability and sharp transitions from solid to gas phase can be used. Materials with slow transitions are also possible. Currently available materials include Unity from Promerus, Inc. Advantageously, types of materials that are used in copper-low-k applications to generate pores can be used.

The sacrificial layer can be, for instance, when the chip materials are copper and a passivated nitride, silicon oxide (which allows selective wet etch using, e.g., HF diluted solutions), or a metal, e.g., aluminum or titanium that can be etched selectively with respect to copper.

It will be appreciated by those skilled in the art that various modifications and changes may be made without departing from the scope of the invention. Such modifications and changes are intended to fall within the scope of the invention, as defined by the appended claims.

What is claimed is:

1. A method for bonding and releasing a first element to and from a second element, the method comprising:
   providing a first element having a main surface;
   providing a sacrificial layer on the main surface of the first element, the sacrificial layer being selectively removable with respect to the first element;
   providing a second element having a main surface;
   applying a removable attachment layer on top of the sacrificial layer or on top of the main surface of the second element;
   bonding the first element to the second element by contacting one element to the removable attachment layer present on the other element, thereby obtaining a composite substrate;
   subjecting the composite substrate to a temperature increase, wherein the first and second elements are released or become easily releasable due to a phase change of the removable attachment layer; and
   removing the sacrificial layer by an etching agent or a solvent after the release of the first and second elements, thereby also removing residues left from the removable attachment layer.

2. The method according to claim 1, wherein the first element is a die or substrate, and the second element is a carrier wafer.

3. The method according to claim 1, wherein the sacrificial layer is removable by selective etching with respect to the first element.

4. The method according to claim 1, wherein the sacrificial layer is soluble in a solvent.

5. The method according to claim 1, wherein the sacrificial layer is isotropically etchable.

6. The method according to claim 1, wherein the removable attachment layer is removable through its decomposition from a solid to a non-solid state, wherein the decomposition is obtained by a thermal process or by illumination.

7. The method according to claim 1, further comprising providing an etch-stop layer on the main surface of the first element, wherein the sacrificial layer is applied over the etch-stop layer.

8. The method according to claim 1, further comprising planarizing the removable attachment layer before bonding.

9. The method according to claim 1, further comprising thinning the first element after bonding the first element to the second element.

10. The method according to claim 9, wherein the thinning is performed by chemical mechanical polishing, grinding or etching.

11. The method according to claim 9, wherein the first element is a die or substrate, and wherein the die or substrate has a thickness greater than about 50 μm before thinning and less than about 50 μm after thinning.

* * * * *